(12) United States Patent
Lee et al.

(10) Patent No.: US 10,920,330 B2
(45) Date of Patent: Feb. 16, 2021

(54) ELECTROLYTIC COPPER FOIL FOR SECONDARY BATTERY AND METHOD FOR PRODUCING THE SAME

(71) Applicant: ILJIN MATERIALS CO., LTD., Iksan (KR)

(72) Inventors: Sun Hyoung Lee, Iksan (KR); Tae Jin Jo, Iksan (KR); Seul-Ki Park, Iksan (KR); Ki Deok Song, Iksan (KR)

(73) Assignee: ILJIN MATERIALS CO., LTD., Iksan-si (KR)

( * ) Notice: Subject to any disclaimer, the term of this patent is extended or adjusted under 35 U.S.C. 154(b) by 0 days.

(21) Appl. No.: 16/343,573

(22) PCT Filed: Mar. 28, 2017

(86) PCT No.: PCT/KR2017/003375
§ 371 (c)(1),
(2) Date: Apr. 19, 2019

(87) PCT Pub. No.: WO2018/088646
PCT Pub. Date: May 17, 2018

(65) Prior Publication Data
US 2019/0249322 A1    Aug. 15, 2019

(30) Foreign Application Priority Data
Nov. 11, 2016  (KR) ........................ 10-2016-0150349

(51) Int. Cl.
*C25D 3/38* (2006.01)
*H01M 10/0525* (2010.01)
(Continued)

(52) U.S. Cl.
CPC ................ *C25D 3/38* (2013.01); *C25D 1/04* (2013.01); *C25D 5/10* (2013.01); *C25D 7/0614* (2013.01);
(Continued)

(58) Field of Classification Search
None
See application file for complete search history.

(56) References Cited

U.S. PATENT DOCUMENTS 5,958,209 A      9/1999  Sakai et al.
2006/0049056 A1*  3/2006  Wang ..................... C25D 7/123
                                                       205/123
(Continued)

FOREIGN PATENT DOCUMENTS

JP      2004241427   *  8/2004  ............... H05K 3/38
JP      2006-108464 A    4/2006
(Continued)

*Primary Examiner* — Stefanie S Wittenberg
(74) *Attorney, Agent, or Firm* — Patent Office of Dr. Chung Park (57) ABSTRACT

The present invention relates to an electrolytic copper foil for a secondary battery and a method of producing the same. The electrolytic copper foil for a secondary battery, in which a burr and curl of a negative electrode plate are inhibited from being formed after an electrolytic copper foil is coated with a negative electrode active material, thereby increasing the loading volume of a negative electrode and increasing a capacity. The electrolytic copper foil for a secondary battery is produced from a plating solution containing Total Organic Carbon (TOC) by using a drum, in which the electrolytic copper foil is formed of one surface that is in direct contact with the drum and the other surface that is an opposite surface of the one surface, and an average cross-sectional grain size of the one surface is 80% or less of an average cross-sectional grain size of the other surface.

5 Claims, 6 Drawing Sheets (51) Int. Cl.
  *C25D 7/06* (2006.01)
  *H05K 1/02* (2006.01)
  *C25D 5/10* (2006.01)
  *H01M 4/04* (2006.01)
  *C25D 1/04* (2006.01)
  *H01M 4/66* (2006.01)

(52) U.S. Cl.
  CPC ......... *H01M 4/043* (2013.01); *H01M 4/0404* (2013.01); *H01M 4/661* (2013.01); *H01M 10/0525* (2013.01); *H05K 1/028* (2013.01); *H05K 2201/0355* (2013.01)

(56) References Cited

U.S. PATENT DOCUMENTS

| | | | | |
|---|---|---|---|---|
| 2007/0287020 A1* | 12/2007 | Saito | ........................ | C25D 1/04 428/606 |
| 2014/0017564 A1* | 1/2014 | Suzuki | ..................... | C25D 5/16 429/211 |
| 2014/0199588 A1 | 7/2014 | Shinozaki et al. | | |
| 2017/0115074 A1* | 4/2017 | Cheng | ..................... | F28F 13/18 |

FOREIGN PATENT DOCUMENTS

| | | | | |
|---|---|---|---|---|
| JP | 2008-294432 A | 12/2008 | | |
| JP | 2013-019037 A | 1/2013 | | |
| JP | 2014-224321 | * 12/2014 | ............... | C25D 1/04 |
| JP | 2015-060703 A | 3/2015 | | |
| JP | 2016-056452 A | 4/2016 | | |
| JP | 2016-184482 | * 10/2016 | ........ | H01M 10/0587 |
| KR | 10-2007-0117465 A | 12/2007 | | |
| KR | 10-2014-0043133 A | 4/2014 | | |

* cited by examiner

BEFORE PRESS

GRAIN SIZE : 0.64μm

3μm

GRAIN SIZE : 0.69μm

AFTER PRESS

GRAIN SIZE : 0.64μm

GRAIN SIZE : 0.65μm

SURFACE CONTACTING DRUM

[FIG. 6]

ELECTROLYTIC COPPER FOIL FOR SECONDARY BATTERY AND METHOD FOR PRODUCING THE SAME

CROSS-REFERENCE TO PRIOR APPLICATIONS

This application is a national Stage Patent Application of PCT International Patent Application No. PCT/KR2017/003375, filed on Mar. 28, 2017 under 35 U.S.C. § 371, which claims priority of Korean Patent Application No. 10-2016-0150349, filed on Nov. 11, 2016, which are all hereby incorporated by reference in their entirety.

TECHNICAL FIELD

The present invention relates to an electrolytic copper foil for a secondary battery and a method of producing the same, and more particularly, to an electrolytic copper foil for a secondary battery, in which a burr and curl of a negative electrode plate are inhibited from being formed after an electrolytic copper foil is coated with a negative electrode active material, thereby increasing the loading volume of a negative electrode and increasing a capacity, and a method of producing the same.

BACKGROUND ART

In general, an electrolytic copper foil is widely used as a basic material of a Printed Circuit Board (PCB) used in electric/electronic industrial fields, and demands thereof are rapidly increasing for small-sized products, such as a thin-type notebook computer, a Personal Digital Assistant (PDA), an e-book player, an MP3 player, a next-generation portable phone, and an ultra-thin flat panel display. Further, the electrolytic copper foil is widely used as a negative electrode current collector of a secondary battery by improving a physical property thereof.

In general, the electrolytic copper foil is generated by an electrolysis method and is produced in an electrolytic bath including a cylindrical negative electrode (which is also called a "drum") made of titanium, a positive electrode, which maintains a predetermined interval with the negative electrode and is made of titanium coated with a lead alloy or an iridium oxide, an electrolyte, and a power source of a current. The electrolyte is formed of sulfuric acid and/or copper sulphate, and when a direct current is made to flow between the negative electrode and the positive electrode while rotating the cylindrical negative electrode, copper is electrodeposited in the negative electrode, thereby continuously producing the electrolytic copper foil. As described above, a process of reducing copper ions to a metal by the electrolysis method is referred to as a foil producing process.

Next, the copper foil obtained by the foil producing process may be subjected to an additional surface treatment process, such as a roughness treatment process (which is also called a nodule treatment process) for improving adhesion with an insulating substrate, a diffusion preventing treatment for preventing diffusion of the copper ions, an anticorrosion treatment for preventing oxidation of the copper foil from the outside, and a chemical adhesion improving treatment for supplementing adhesion with the insulating substrate as necessary. When the surface treatment process passes, the copper foil becomes the copper foil for a low profile printed circuit, and when only the anticorrosion treatment is performed among the surface treatment processes, the copper foil becomes the copper foil for the secondary battery.

When the electrodeposited copper foil is used for the printed circuit, the copper foil is surface treated and then is supplied to a PCB processing company in the form (a laminated form) of being attached to the insulating substrate. In contrast to this, when the electrodeposited copper foil is used for a secondary battery, the copper foil passes only the anticorrosion treatment and is supplied to a secondary battery producing company.

When the electrolytic copper foil is used as a negative electrode current collector for a secondary battery, the copper foil is used by coating both surfaces of the copper foil with an electrode active material. In this case, when intensities of illumination of both surfaces of the electrolytic copper foil are different, a battery characteristic is changed, so that it is necessary to maintain the same or similar level of the intensities of illumination of both surfaces of the electrolytic copper foil.

In addition, in order to increase strength of the electrolytic copper foil, a method of coating the copper foil with a negative electrode active material and then rolling the copper foil is used. When the copper foil is rolled, strength may be increased, but when a high density and a high pressure are applied to the copper foil, a burr or curl is formed to cause transformation of the copper foil, thereby negatively affecting a capacity of a secondary battery.

Accordingly, there is a demand for an electrolytic copper foil for a secondary battery, which is capable of increasing strength of the copper foil and preventing formation of a burr or curl of a copper foil even from being formed when a high density and a high pressure are applied to the copper foil.

DISCLOSURE

Technical Problem

The present invention provides an electrolytic copper foil for a secondary battery, in which Total Organic Carbon (TOC) is made to be contained in a copper electrolyte by a predetermined content to decrease a grain size, thereby improving strength of a copper foil, and a method of producing the same.

The present invention provides an electrolytic copper foil for a secondary battery, in which even when an electrolytic copper foil is pressed at a high density and a high pressure after being coated with a negative electrode active material, a burr and curl of a negative electrode plate are inhibited from being formed, thereby increasing the loading volume of a negative electrode and increasing a capacity of a battery, and a method of producing the same.

Technical Solution

According to one aspect of the present invention, exemplary embodiments of the present invention include an electrolytic copper foil for a secondary battery produced from a plating solution containing Total Organic Carbon (TOC) by using a drum, in which the electrolytic copper foil is formed of one surface that is in direct contact with the drum and the other surface that is an opposite surface of the one surface, and an average cross-sectional grain size of the one surface is 80% or less of an average cross-sectional grain size of the other surface.

The average cross-sectional grain size of the one surface that is in direct contact with the drum in the electrolytic copper foil may be 0.5 µm to 1.55 µm.

The average cross-sectional grain size of the other surface that is the opposite surface of the one surface in the electrolytic copper foil may be 1.5 µm to 2.1 µm.

The electrolytic copper foil is pressed after being coated with a negative electrode active material, and an average cross-sectional grain size of the electrolytic copper foil before the press may be 0.5 µm to 1 µm or less, and the average cross-sectional grain size of the electrolytic copper foil after the press may be 90% or more of the average cross-sectional grain size of the electrolytic copper foil before the press.

An average cross-sectional grain size of the electrolytic copper foil after the press may be 0.45 µm to 0.9 µm.

A concentration of the TOC contained in the plating solution may be equal to or larger than 100 ppm.

Strength of the press may be 4 Mpa or greater.

Tensile strength of the electrolytic copper foil may be 30 kgf/mm$^2$ to 50 kgf/mm$^2$.

An elongation percentage of the electrolytic copper foil may be 2% to 12%.

A thickness of the electrolytic copper foil may be 2 µm to 10 µm.

According to another aspect of the present invention, exemplary embodiments of the present invention include a method of producing an electrolytic copper foil for a secondary battery, the method including: (1) preparing a plating solution containing copper and Total Organic Carbon (TOC); (2) applying a current density of 30 Ampere per Square Deci-metre (ASD) to 150 ASD under a temperature condition of 30° C. to 70° C. and performing electroplating by using a drum; and (3) coating an electrolytic copper foil formed by the electroplating with a negative electrode active material and pressing the electrolytic copper foil, in which the electrolytic copper foil formed by the electroplating in operation (2) is formed of one surface that is in contact with the drum and the other surface that is an opposite surface of the one surface, and an average cross-sectional grain size of the one surface is 80% or less of an average cross-sectional grain size of the other surface.

A concentration of the TOC contained in the plating solution may be equal to or larger than 100 ppm.

Tensile strength of the electrolytic copper foil may be 30 kgf/mm$^2$ to 50 kgf/mm$^2$.

An elongation percentage of the electrolytic copper foil may be 2% to 15%.

A thickness of the electrolytic copper foil may be 2 µm to 10 µm.

An average cross-sectional grain size of the electrolytic copper foil before the press may be 0.5 µm to 1 µm or less, and the average cross-sectional grain size of the electrolytic copper foil after the press may be 90% or more of the average cross-sectional grain size of the electrolytic copper foil before the press.

Advantageous Effects

According to the present invention, TOC is made to be contained in a copper electrolyte by a predetermined content to decrease a grain size, thereby achieving an effect in that it is possible to improve strength of a copper foil.

According to the present invention, TOC is made to be contained in a copper electrolyte by a predetermined content, so that even when an electrolytic copper foil is pressed at a high density and a high pressure after being is coated with a negative electrode active material, a burr and curl of a negative electrode plate are inhibited from being formed, thereby increasing a capacity of a battery.

BEST MODE

Other specific matters of the exemplary embodiment are included in the detailed description and the drawings.

Advantages and characteristics, and a method for achieving them will be clear when exemplary embodiments described in detail with reference to the accompanying drawings are referred to. However, the present invention is not limited to exemplary embodiments disclosed herein but will be implemented in various forms, and the exemplary embodiments are provided so that the present invention is completely disclosed, and a person of ordinary skilled in the art can fully understand the scope of the present invention, and the present invention will be defined only by the scope of the appended claims. Further, in the drawing, a part irrelevant to the present invention is omitted for clearness of the description of the present invention, and like reference numerals designate like elements throughout the specification.

Hereinafter, the present invention will be described with reference to the accompanying drawings.

Next, an electrolytic copper foil for a secondary battery according to an exemplary embodiment of the present invention will be described in more detail.

Figure 1:
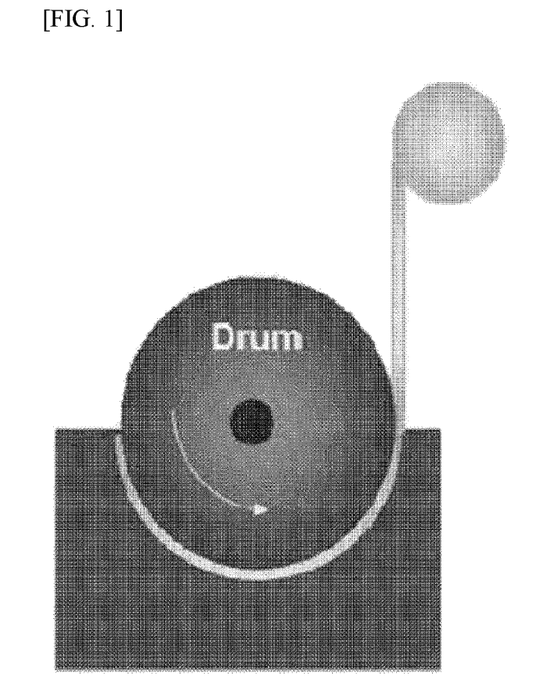
FIG. 1 is a diagram illustrating an operation of producing an electrolytic copper foil by using a drum according to an exemplary embodiment of the present invention.

An electrolytic copper foil for a secondary battery according to an exemplary embodiment of the present invention is produced by rotating a copper foil by using a drum. FIG. 1 is a diagram illustrating an operation of producing an electrolytic copper foil by using a drum according to an exemplary embodiment of the present invention. Then, in order to enhance strength of the electrolytic copper foil, the electrolytic copper foil is pressed, and in this case, a burr or curl may be formed in the electrolytic copper foil due to a high density and a high pressure in the press process. The present invention has an effect in that it is possible to easily maintain a form of the electrolytic copper foil because a change in a physical property of the electrolytic copper foil is little before and after the press.

Figure 2:
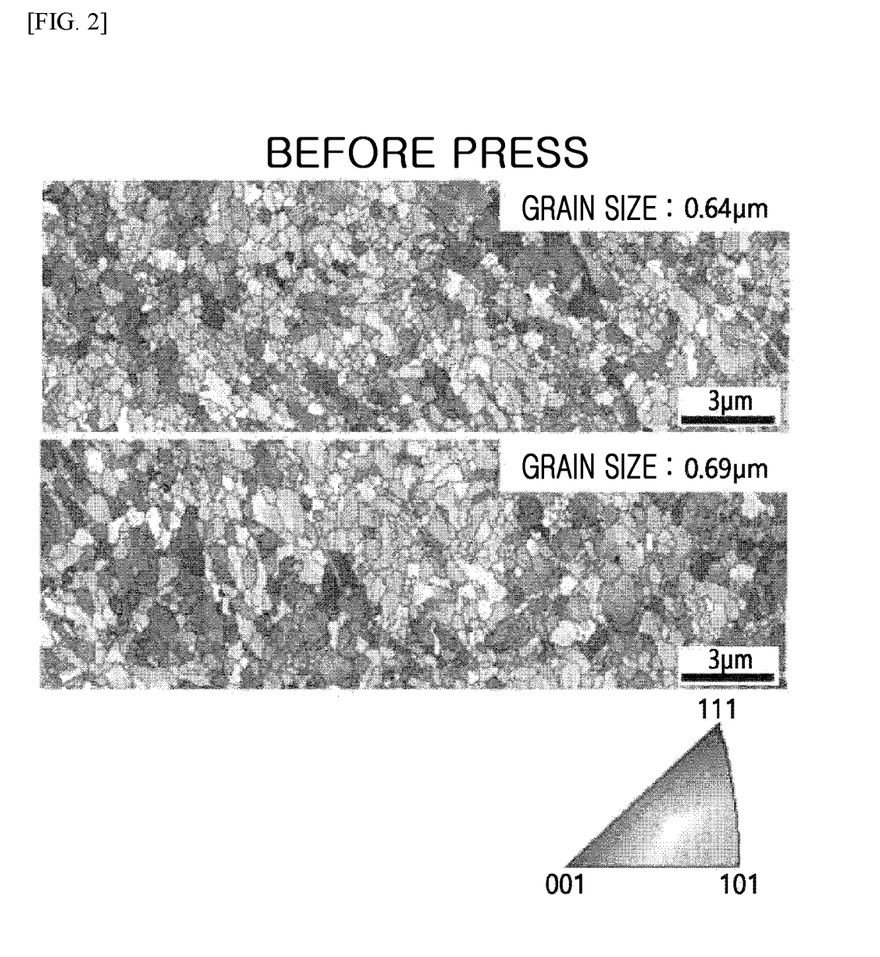
FIG. 2 is a diagram illustrating a cross-sectional grain size of the electrolytic copper foil before press according to the exemplary embodiment of the present invention.
Figure 3:
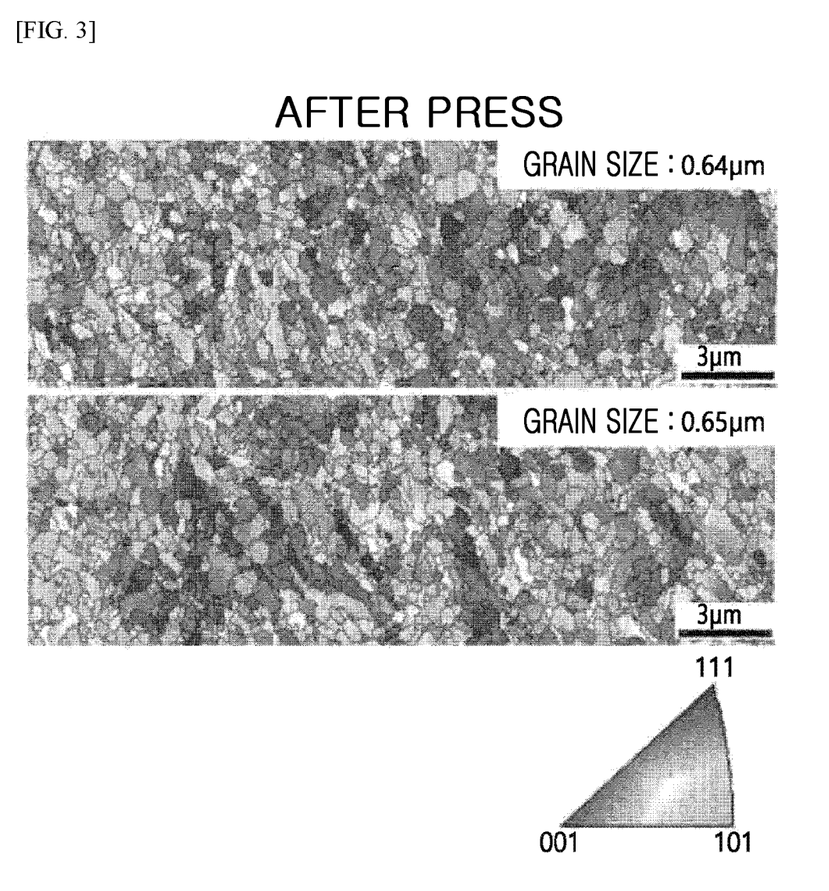
FIG. 3 is a diagram illustrating a cross-sectional grain size of the electrolytic copper foil after press according to the exemplary embodiment of the present invention.

Further, the electrolytic copper foil for the secondary battery according to the exemplary embodiment of the present invention is the electrolytic copper foil for the secondary battery produced by using a drum, and an average cross-sectional grain size of the electrolytic copper foil before the press may be 0.5 μm to 1 μm, and an average cross-sectional grain size of the electrolytic copper foil after the press may be 90% or more of the average cross-sectional grain size of the electrolytic copper foil before the press. FIG. 2 is a diagram illustrating a cross-sectional grain size of the electrolytic copper foil before the press according to the exemplary embodiment of the present invention, and FIG. 3 is a diagram illustrating a cross-sectional grain size of the electrolytic copper foil after the press according to the exemplary embodiment of the present invention.

When an average cross-sectional grain size of the electrolytic copper foil before the press is less than 0.5 μm, the grain size is too small, so that the grain cannot serve as a barrier within the electrolytic copper foil to cause a problem, and when an average cross-sectional grain size of the electrolytic copper foil before the press is greater than 1 μm, grain boundaries are decreased, so that there may be a problem in that strength of the electrolytic copper foil is degraded.

Figure 4:
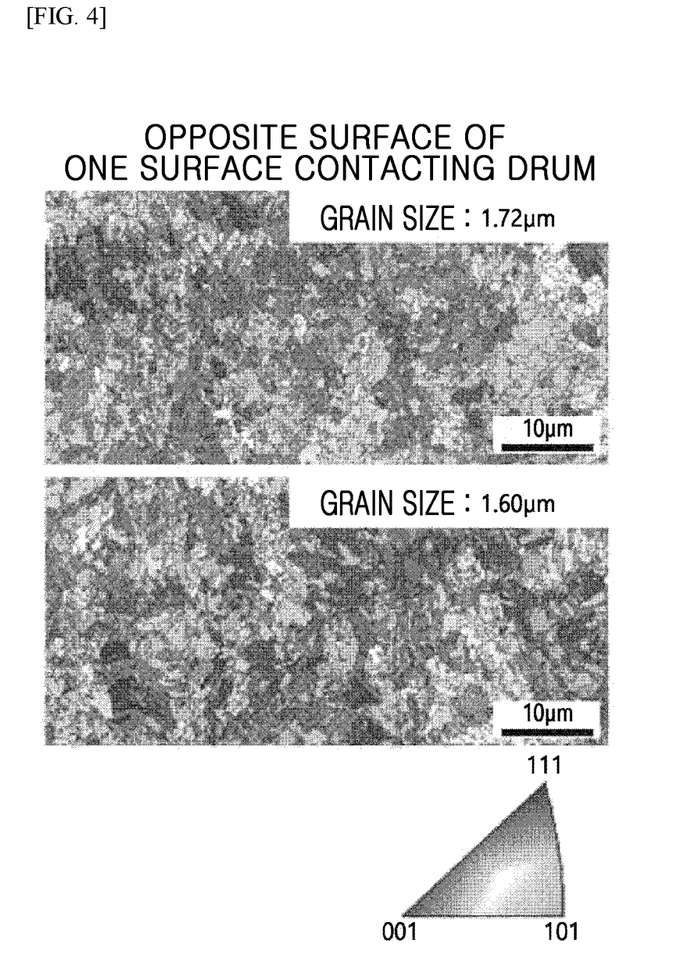
FIG. 4 is a diagram illustrating a grain size of an opposite surface of one surface that is in contact with the drum according to the exemplary embodiment of the present invention.
Figure 5:
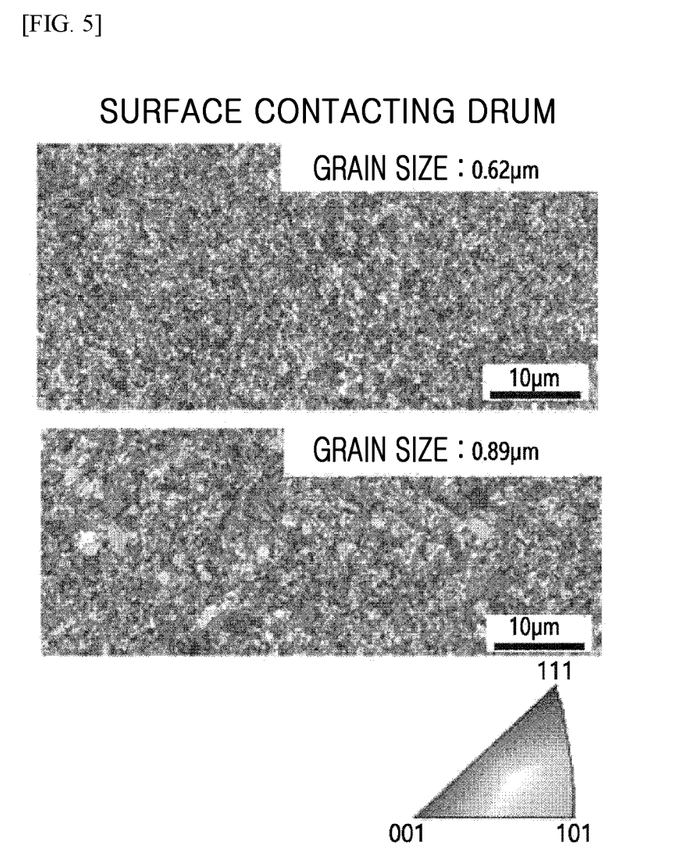
FIG. 5 is a diagram illustrating a grain size of one surface that is in contact with the drum according to the exemplary embodiment of the present invention.

The electrolytic copper foil according to the present invention is formed of one surface that is in direct contact with the drum and the other surface that is an opposite surface of the one surface, and an average cross-sectional grain size of the one surface may be 80% or less of an average cross-sectional grain size of the other surface. For reference, the average cross-sectional grain sizes of the one surface and the other surface may mean the average cross-sectional grain sizes of the one surface and the other surface at a room temperature, and the room temperature means a temperature range of 15° C. to 25° C. When the average cross-sectional grain size of the one surface is 80% or greater of the average cross-sectional grain size of the other surface, a difference between a grain size of the one surface that is in direct contact with the drum and a grain size of the other surface that is the opposite surface of the one surface is decreased in a press operation and the grain cannot serve as a buffer in the press operation, thereby causing a problem in that the electrolytic copper foil is transformed after the press. FIG. 4 is a diagram illustrating a grain size of the opposite surface of the one surface that is in contact with the drum according to the exemplary embodiment, and FIG. 5 is a diagram illustrating a grain size of the one surface that is in direct contact with the drum according to the exemplary embodiment.

The average cross-sectional grain size of the one surface of the electrolytic copper foil may be 0.5 μm to 1.55 μm. When the average cross-sectional grain size of the one surface of the electrolytic copper foil is less than 0.5 μm, the grain size is too small, so that the grain cannot serve as a barrier within the electrolytic copper foil to cause a problem, and when the average cross-sectional grain size of the one surface of the electrolytic copper foil is larger than 1.55 μm, grain boundaries are decreased, so that there may be a problem in that strength of the electrolytic copper foil is degraded.

Further, the average cross-sectional grain size of the other surface of the electrolytic copper foil may be 1 μm to 2.1 μm. When the average cross-sectional grain size of the other surface of the electrolytic copper foil is less than 1.5 μm, the grain size is too small, so that the grain cannot serve as a barrier within the electrolytic copper foil to cause a problem, and when the average cross-sectional grain size of the other surface of the electrolytic copper foil is greater than 2.1 μm, grain boundaries are decreased, so that there may be a problem in that strength of the electrolytic copper foil is degraded.

When an electrolytic copper foil is generally produced, in order to increase strength of the electrolytic copper foil, a method of pressing an electrolytic copper foil at a high density and a high pressure after coating the electrolytic copper foil with a negative electrode active material is used. Accordingly, when the electrolytic copper foil is pressed at a high density and a high pressure, strength of the electrolytic copper foil may be increased, but the electrolytic copper foil is transformed due to a burr and curl formed in the electrolytic copper foil after the press, so that the press method at a high density and a high pressure is not preferable.

Accordingly, high yield strength is required in order to prevent the copper foil from being transformed when the electrolytic copper foil is pressed, and in order to obtain high yield strength, a size of a grain formed on a surface of the electrolytic copper foil needs to be small. As the size of the grain formed on the surface of the electrolytic copper foil is smaller, the number of grain boundaries is increased, and the grain boundary is an obstacle of slip and serves as a barrier in the electrolytic copper foil, so that when the grain boundaries are increased in a predetermined area, strength of the electrolytic copper foil is increased. As described above, even when the electrolytic copper foil is pressed at a high density and a high pressure, in order to prevent the electrolytic copper foil from being transformed, it is important to make the grain size be small.

In the related art, in order to make a grain size be small, a method of inserting an additive to a plating solution and inducing the inserted additive to exhibit a pinning effect to a grain boundary during plating to inhibit a grain from being grown is used. However, in the related art, the grain size is changed and transformed after an electrolytic copper foil is pressed, so that it is difficult to maintain an existing form of the grain, and thus when the electrolytic copper foil is pressed at a high density and a high pressure, a burr or curl is formed to cause the transformation of the electrolytic copper foil.

In the present invention, in order to solve the problem in the related art, TOC of 100 ppm or more is made to be contained in the copper electrolyte used when the electrolytic copper foil is plated, so that it is possible to prevent the copper foil from being transformed even when the electrolytic copper foil is pressed at a high density and a high temperature, thereby maintaining the form of the electrolytic copper foil.

TOC contained the copper electrolyte is an abbreviation of total organic carbon and refers to total organic carbon, and means the amount of carbon in an organic material contained in the electrolyte, and is contained in the copper electrolyte to serve to decrease a grain size. When Total Inorganic Carbon (TIC), not the TOC, and carbon adsorbed to copper ions is present in the copper electrolyte, it is difficult to maintain a predetermined ratio of a grain size.

Figure 6:
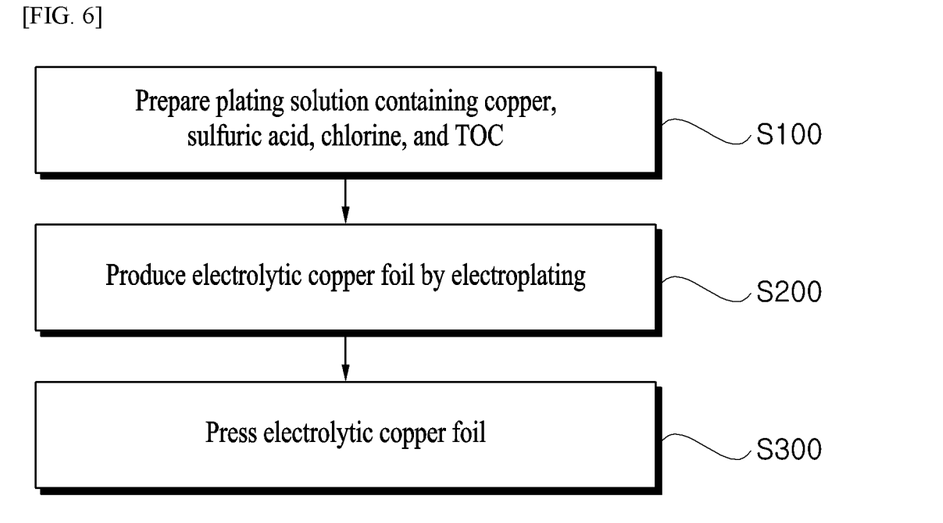
FIG. 6 is a flowchart illustrating a method of producing an electrolytic copper foil for a secondary battery according to an exemplary embodiment of the present invention.

FIG. 6 is a flowchart illustrating a method of producing an electrolytic copper foil for a secondary battery according to an exemplary embodiment of the present invention. Referring to FIG. 6, a method of producing an electrolytic copper foil for a secondary battery according to the present invention includes: (1) preparing a plating solution containing copper ions ($Cu^{2+}$) of 60 g/L to 140 g/L, sulfuric acid of 70 g/L to 200 g/L, chlorine of 10 ppm to 90 ppm, and TOC of 100 ppm or more (S100); (2) applying a current density of 30 ASD to 150 ASD under a temperature condition of 30° C.

to 70° C. and performing electroplating by using a drum (S200); and (3) coating the electrolytic copper foil formed by the electroplating with a negative electrode active material and then pressing the electrolytic copper foil (S300).

In operation (1) (S100), as the operation of preparing the plating solution, the plating solution containing copper ions ($Cu^{2+}$) of 60 g/L to 140 g/L, sulfuric acid of 70 g/L to 200 g/L, chlorine of 10 ppm to 90 ppm, and TOC of 100 ppm or more is prepared. In the plating solution, the TOC enables a grain size of the electrolytic copper foil to maintain a predetermined ratio. It is preferable that the concentration of the TOC is 100 ppm or more, but it is more preferable that the concentration of the TOC is 100 ppm to 650 ppm. When the electrolytic copper foil is coated with the negative electrode active material and is then pressed, the TOC minimizes a change in the grain size even before and after the press, so that it is possible to easily maintain the form of the grain. When the concentration of the TOC is out of the range, a burr or curl may be formed in the electrolytic copper foil after the press.

When the copper ions and the sulfuric acid ions in the plating solution are out of the range, there is a problem in that the copper foil is not properly precipitated or hardness of the copper foil is degraded in the subsequently performed electroplating.

In addition, it is preferable that chlorine of 10 ppm to 90 ppm is contained in the plating solution, and the chlorine inhibits crystal growth of precipitates of $CuCl_2$ formed on a grain boundary interface during the electroplating when the precipitates are heated at a high temperature to improve thermal stability at a high temperature. When a concentration of the chlorine is out of the range of 10 ppm to 90 ppm, tensile strength of the electrolytic copper foil may be degraded and thermal stability of the electrolytic copper foil at a high temperature may be degraded.

In operation (2) (S200), a current density of 30 ASD to 150 ASD is applied the plating solution prepared in operation (1) under a temperature condition of 30° C. to 70° C., and electroplating is performed by using a drum. When the plating temperature and the current density are out of the foregoing ranges, the plating is not property performed, so that a surface of the electrolytic copper foil is not uniformly formed, or tensile strength and an elongation rate are degraded, thereby causing degradation of performance of a battery.

Operation (3) (S300) includes an operation of coating the electrolytic copper foil formed by the electroplating with a negative electrode active material and then pressing the electrolytic copper foil. The electrolytic copper foil may be pressed at strength of 4 MPa or greater, and when strength of the press is less than 4 Mpa, curl may not be formed, so that strength of the press of less than 4 Mpa is not preferable.

Further, tensile strength of the electrolytic copper foil for the secondary battery according to the present invention may be 30 kgf/mm² to 50 kgf/mm².

When the tensile strength is less than 30 kgf/mm², the electrolytic copper foil may be transformed or fractured in the press manufacturing process after the electrolytic copper foil is coated with the negative electrode active material. When the secondary battery is charged/discharged, the secondary battery is expanded or contracted in a process where other active materials, such as graphite, transceive lithium ions, and in this case, an active material layer is in close contact with the electrolytic copper foil, so that stress is generated due to the expansion or the contraction. When the tensile strength is less than 30 kgf/mm², the electrolytic copper foil cannot resist the stress and is fractured, so that it is impossible to maintain performance of the battery, and the electrolytic copper foil is transformed due to the fracture, so that there is a problem in that the positive electrode and the negative electrode are short-circuited.

Further, an elongation percentage of the electrolytic copper foil for the secondary battery according to the present invention may be 2% to 12%.

When the elongation percentage of the electrolytic copper foil is large, the electrolytic copper foil resists tension when the active material is coated in an electrode manufacturing process to prevent the electrolytic copper foil from being fractured in the process, and it is possible to prevent the electrolytic copper foil from being fractured due to stress applied in a process of winding an electrode. In addition, during a charging/discharging cycle of the battery, the battery is prevented from efficiency degradation and from being fractured to improve performance of the battery. However, when the elongation percentage is larger than 15%, the secondary battery is considerably transformed during the charging/discharge to cause a short circuit, and when the elongation percentage is less than 2%, the electrolytic copper foil may be easily fractured.

The tensile strength and the elongation percentage are inversely proportional to each other, so that when the tensile strength is increased, the elongation percentage is decreased, and when the tensile strength is decreased, the elongation percentage is increased. Therefore, in order to produce the electrolytic copper foil, which is prevented from being fractured and has high tensile strength, it is important to maintain tensile strength and an elongation percentage within appropriate ranges. Accordingly, it is preferable that the tensile strength maintains 30 kgf/mm² to 50 kgf/mm², and when the elongation percentage maintains the range of 2% to 15%, it is possible to prevent the positive electrode and the negative electrode from being short-circuited when the secondary battery is transformed.

Further, a thickness of the electrolytic copper foil for the secondary battery according to the present invention may be 2 μm to 10 μm. When the thickness of the electrolytic copper foil is less than 2 μm, the electrolytic copper foil may be easily fractured, and when the thickness of the electrolytic copper foil is larger than 10 μm, a volume and weight of a produced secondary battery are increased, so that the thickness of the electrolytic copper foil larger than 10 μm is not preferable.

Hereinafter, Examples of the present invention and Comparative Examples will be described. However, the Examples below are simply examples of the present invention, and the scope of the present invention is not limited by the Examples.

Test of Performance of Copper Foil According to Concentration of TOC

Example 1

A plating solution containing copper ions of 100 g/L, sulfuric acid of 130 g/L, chlorine of 30 ppm, and TOC of 360 ppm was prepared, and electroplating was performed at a temperature of 50° C. by applying a current density of 90 ASD by using a drum. Then, an electrolytic copper foil formed by the electroplating was coated with a negative electrode active material and then was pressed at strength of 4 Mpa.

Examples 2 to 8

Electrolytic copper foils were produced by the same manner as that of Example 1, except for concentrations of TOC contained in plating solutions and press strength after the electrolytic copper foils were produced, which are represented in Tables 1 and 2 below.

Comparative Examples 1 to 3

In Comparative Examples 1 to 3, electrolytic copper foils were produced under the same condition as that of Example 1, except that TOC was inserted by 100 ppm or less as represented in Table 2 when plating solutions are prepared.

The experiment conditions of Examples 1 to 8 and Comparative Examples 1 to 3 are described above, tensile strength, an elongation percentage, press strength (Mpa), curl after press, an average cross-sectional grain size after press, an average cross-sectional grain size before press of each of the electrolytic copper foils for the secondary battery produced by the methods were measured and a ratio of the average cross-sectional grain size after press to the average cross-sectional grain size before press was calculated, and a grain size of one surface that is in contact with the drum and a grain size of the other surface opposite to the one surface were measured and a ratio of the grain size of one surface that is in contact with the drum to the grain size of the other surface opposite to the one surface was calculated, which are represented in Tables 1 and 2 below.

A maximum load of tensile strength measured by collecting a tensile specimen having a width of 12.7 mm×a gauge length of 50 mm from the electrolytic copper foil obtained from each of Examples 1 to 8 and Comparative Examples 1 to 3 and performing a tensile test at a speed of a crosshead of 50.8 mm/min under the standard of IPC-TM-650 2.4.18B is referred to as tensile strength, and an elongation percentage when the electrolytic copper foil is fractured is referred to as an elongation percentage.

TABLE 1

| Category | Thickness (μm) | TOC Concentration (ppm) | Rolling press strength (Mpa) | Tensile strength (kgf/mm²) | Elongation percentage (%) |
|---|---|---|---|---|---|
| Example 1 | 4 | 360 | 4 | 43.7 | 3.2 |
| Example 2 | 6 | 250 | 5 | 42.3 | 7.2 |
| Example 3 | 6 | 102 | 4 | 35.2 | 7.8 |
| Example 4 | 8 | 1080 | 5 | 45.3 | 7.5 |
| Example 5 | 8 | 120 | 4 | 31.8 | 11.8 |
| Example 6 | 10 | 650 | 5 | 41.3 | 11.8 |
| Example 7 | 10 | 480 | 4 | 33.6 | 11.9 |
| Example 8 | 10 | 350 | 4 | 49.2 | 10.5 |
| Comparative Example 1 | 6 | 76 | 4 | 35.1 | 6.2 |
| Comparative Example 2 | 8 | 95 | 4 | 34.4 | 11.0 |
| Comparative Example 3 | 10 | 54 | 4 | 33.0 | 12.4 |

TABLE 2

| Category | Average cross-sectional grain size (μm) after press/Average cross-sectional grain size (μm) before press | Grain size (μm) of one surface that is in contact with drum/Grain size (μm) of the other surface opposite to one surface | Curl (mm) after press |
|---|---|---|---|
| Example 1 | 1 (0.64/0.64) | 0.40 (0.75/1.86) | 0 |
| Example 2 | 1 (0.88/0.88) | 0.41 (0.81/1.95) | 5 |
| Example 3 | 0.91 (0.92/1.01) | 0.77 (1.51/1.96) | 18 |
| Example 4 | 0.94 (0.65/0.69) | 0.36 (0.62/1.72) | 6 |
| Example 5 | 0.94 (0.64/0.68) | 0.55 (0.89/1.6) | 8 |
| Example 6 | 1 (1.01/1.01) | 0.51 (0.92/1.78) | 2 |
| Example 7 | 0.97 (1.09/1.12) | 0.37 (0.78/2.07) | 4 |
| Example 8 | 1 (0.78/0.78) | 0.41 (0.76/1.85) | 1 |
| Comparative Example 1 | 0.89 (0.71/0.79) | 0.81 (1.59/1.96) | 25 |
| Comparative Example 2 | 0.88 (0.74/0.84) | 0.81 (1.69/2.07) | 21 |
| Comparative Example 3 | 0.89 (0.99/1.12) | 0.83 (1.71/2.04) | 28 |

Referring to Tables 1 and 2, in Comparative Examples 1 to 3, in which the TOC concentrations are less than 100 ppm, it can be seen that the average cross-sectional grain size of the electrolytic copper foil after the press is less than 90% of the average cross-sectional grain size of the electrolytic copper foil before the press, and curl formed after the press exceeds 20 mm. This means that the electrolytic copper foil is transformed after the press, so that a burr or curl is formed in the press process, and when the burr or curl is formed, a capacity of the battery may be decreased. Meanwhile, referring to Examples 1 to 8, in which the TOC concentrations are larger than 100 ppm, it can be seen that the average cross-sectional grain size of the electrolytic copper foil after the press is equal to or larger than 90% of the average cross-sectional grain size of the electrolytic copper foil before the press, and in this case, it can be seen that the curl formed after the press is suppressed to have 20 mm or less.

Referring to the ratio of the grain size of one surface that is in contact with the drum to the grain size of the other surface opposite to the one surface, all of the ratios are equal to or smaller than 80% in Examples 1 to 8. In order to prevent the burr or curl from being formed in the electrolytic copper foil even after the press, the ratio of the grain size of one surface that is in contact with the drum to the grain size of the other surface opposite to the one surface needs to be 80% or less, and in this case, the grain serves as a buffer even after the press, thereby preventing the electrolytic copper foil from being transformed. Accordingly, in Examples 1 to 8 in which the ratio of the grain size of one surface that is in contact with the drum to the grain size of the other surface opposite to the one surface is 80% or less, it can be seen that the curl of 20 mm or less is formed after the press, so that the curl is suppressed from being formed in the electrolytic copper foil. Meanwhile, in Comparative Examples 1 to 8 in which the ratio of the grain size of one surface that is in contact with the drum to the grain size of the other surface opposite to the one surface is larger than 80%, the curl formed after the press is larger than 20 mm, and the TOC concentration in this case is less than 100 ppm, so that it can be seen that the TOC concentration within the plating solution affects the grain size of the electrolytic copper foil and also affects the formation of the curl after the press in the production of the electrolytic copper foil.

It will be understood by those skilled in the art that various changes in a specific form and details may be made therein without the change of the technical spirit or the essential features of the present invention. Thus, it is to be appreciated that the embodiments described above are intended to be illustrative in every sense, and not restrictive. The scope of the present invention is represented by the scope of the claims described below rather than the detailed description, and it shall be construed that all of the changes or modified forms derived from the meanings and the scope of the claims, and the equivalent concept thereof are included in the scope of the present invention.

The invention claimed is:

1. A method of producing an electrolytic copper foil for a secondary battery, the method comprising:
   (1) preparing a plating solution containing copper ions and Total Organic Carbon (TOC);
   (2) applying a current density that is higher than 70 Ampere per Square Deci-metre (ASD) and equal to or lower than 150 ASD under a temperature condition of 30° C. to 70° C. and performing electroplating by using a drum; and
   (3) coating an electrolytic copper foil formed by the electroplating with a negative electrode active material and pressing the electrolytic copper foil,
   wherein the electrolytic copper foil formed by the electroplating in operation (2) is formed of one surface that is in contact with the drum and the other surface that is an opposite surface of the one surface, and an average grain size of the one surface is 80% or less of an average grain size of the other surface,
   wherein a concentration of the TOC contained in the plating solution is equal to or higher than 450 ppm, and
   wherein an average cross-sectional grain size of the electrolytic copper foil before the step of pressing is 0.5 µm to 1 µm or less, and the average cross-sectional grain size of the electrolytic copper foil after the step of pressing is 90% or more of the average cross-sectional grain size of the electrolytic copper foil before the step of pressing.

2. The method of claim 1, wherein tensile strength of the electrolytic copper foil is 30 kgf/mm² to 50 kgf/mm².

3. The method of claim 1, wherein an elongation percentage of the electrolytic copper foil is 2% to 15%.

4. The method of claim 1, wherein a thickness of the electrolytic copper foil is 2 µm to 10 µm.

5. The method of claim 1, wherein a concentration of the copper ions contained in the plating solution is higher than 110 g/L and equal to or lower than 140 g/L.

* * * * *